(12) United States Patent
Miller et al.

(10) Patent No.: US 6,720,194 B1
(45) Date of Patent: Apr. 13, 2004

(54) SEMICONDUCTOR CHARACTERIZATION AND PRODUCTION INFORMATION SYSTEM

(75) Inventors: William Miller, Phoenix, AZ (US); Shehanshu Shah, Austin, TX (US); Thomas Martis, Chandler, AZ (US)

(73) Assignee: Siverion, Inc., Tempe, AZ (US)

( * ) Notice: Subject to any disclaimer, the term of this patent is extended or adjusted under 35 U.S.C. 154(b) by 0 days.

(21) Appl. No.: 10/262,737

(22) Filed: Oct. 2, 2002

(51) Int. Cl.[7] ............................................. H01L 21/66
(52) U.S. Cl. ...................................................... 438/14
(58) Field of Search ............................................ 438/14

(56) References Cited

U.S. PATENT DOCUMENTS 6,303,395 B1 * 10/2001 Nulman ........................ 438/14

* cited by examiner

*Primary Examiner*—John F. Niebling
*Assistant Examiner*—Andre' Stevenson
(74) *Attorney, Agent, or Firm*—Donald J. Lenkszus (57) ABSTRACT

A system in accordance with the present invention provides characterization information for semiconductor products. The system includes a plurality of data sources, each providing data pertaining to the products. A server is coupleable to each data source. A database is coupled to the server for storing data from the data sources. An automatic data collection engine at the server automatically collects data from the sources. A characterization engine resident at the server operates on the data to provide characterization information. A reporting application engine operable at the server generates characterization reports from the characterization information. The characterization reports are selectable.

21 Claims, 10 Drawing Sheets

Bin/Sort & Parametric

Product
Lots
Wafers
Die or Sites
Operation
Parameter

↑
4003

Characterization & Final Test

Product
Lots
Wafers
Part
Pin
Test
Condition
Parameters

**What*IF* Edit Table**

**What*IF* Test Navigator**

WhatIF Test Summary Histogram

SEMICONDUCTOR CHARACTERIZATION AND PRODUCTION INFORMATION SYSTEM

FIELD OF THE INVENTION

This invention relates generally to systems and methods for collecting and distributing manufacturing information, in general, and to systems and methods for collecting and distributing information within a semiconductor manufacturing fabrication environment.

BACKGROUND OF THE INVENTION

Semiconductor device manufacturing is fast becoming disaggregated as companies focus on core competencies and contract out all other work. The result is the proliferation of so-called "fabless" semiconductor manufacturers.

In many instances, fabless semiconductor companies have their operations and data spread across a global supply chain. By way of example, a fabless company may design a chip with engineers located in California, have the wafers (each consisting of many devices) fabricated in Taiwan, have wafer testing occur in Taiwan, yet have assembly of the device occur in Malaysia and the characterization and qualification occur in California. To meet short market windows of opportunity, a fabless semiconductor company's information systems must support rapid decision-making. Otherwise, yield loss at any node in the supply chain causes a loss of revenue and increased work in progress material.

Fabless semiconductor companies face a number of challenges in getting product to market in a timely manner. Moving new components out of design, into prototypes and finally into production to meet a market window is critical to success. If engineering productivity does not keep pace with design and manufacturing complexities, the result is lost opportunities. Tracking quality to optimize yield is more important and proportionately more difficult across the distributed supply chain of a fabless manufacturer. Compounding the difficulty is a rapidly shrinking product life cycle that makes timely sharing of semiconductor data across remote locations in a timely manner even more critical.

In the past, when a product is outsourced for an individual operation, and is returned to the processing facility, a hard table or printout of the data associated with that operation is typically returned with the product. Similarly, a semiconductor device completed at the fabrication facility may be shipped to an assembly facility where it is actually bonded to external wires and packaged. It would be desirable to be able to integrate this data with the data from the processing facility to have a better understanding of failure mechanisms within the device.

It is desirable to provide a means that will help product engineers identify and act quickly on chip manufacturing issues so that designs may move quickly from concept to final product in the shortest amount of time and in an economically viable way.

It is therefore desirable to provide a platform for aggregation of data from geographically diverse sources, automating the management of the data, analyzing the data to solve design and manufacturing problems, and for providing interpretive advice where applicable. With such a platform, product engineers and operations managers may be provided with meaningful data that will be used to make good decisions—decisions that make the difference between profit and loss.

Such data should include device characterization data and production monitoring data. Device characterization is performed to insure that a part functions over the complete operating range (e.g., ambient temperature, power supply voltages, clock frequency, etc.) specified for the product.

SUMMARY OF THE INVENTION

A system in accordance with the present invention provides characterization and production monitoring information for semiconductor products. The system includes a plurality of data sources, each providing data pertaining to the products. A server is coupleable to each data source. A database is coupled to the server for storing data from the data sources. An automatic data collection engine at the server automatically collects data from the sources. A characterization engine resident at the server operates on the data to provide characterization information. A reporting application engine operable at the server generates characterization reports from the characterization information. The characterization reports are selectable. The system provides a platform that integrates and analyzes information from chip design, fabrication, and test. Utilizing an Internet or worldwide web based interface, database and statistical tools, the platform provides immediate access to manufacturing data and automates critical analysis enabling engineers to identify and solve manufacturing issues.

The present invention provides an interactive analysis and data management solution that is particularly advantageous to fabless semiconductor companies. The platform provided by the invention automatically captures data from all semiconductor manufacturing data sources required for engineering analysis. Data types supported by the illustrative embodiment of the invention include lot, wafer, and equipment history, defect, electrical test, metrology, wafer sort and final test.

With a platform in accordance with the principles of the invention, operations managers and product engineers are able to detect and solve manufacturing issues as they occur. The platform in accordance with the invention eliminates time-consuming data translation and validation by automating all data collection activities. The platform provides an intuitive user interface and powerful statistical engine to enable users to quickly correlate data, thus accelerating problem identification and resolution. All analysis and reports created by a platform in accordance with the principles of the invention may be viewed, manipulated and published using standard computer applications software.

The present invention includes a device characterization and production monitoring program that uniquely helps design and product engineers manage, visualize, and analyze the massive amount of data typically created to support verification of a device.

BRIEF DESCRIPTION OF THE DRAWINGS

The invention will be better understood from a reading of the following detailed description taken in conjunction with the accompanying drawing figures in which like reference numbers indicate like features and wherein.

DETAILED DESCRIPTION

The present invention is an improvement over the system described in copending patent application Ser. No. 09/896, 170 filed Jun. 29, 2001 which was published on Jan. 3, 2002 as Patent Publication No. 2002/0002560 and which claims priority based upon provisional application for patent No. 60/215,490 filed Jun. 30, 2000. The disclosures of those prior applications are incorporated herein by reference.

In semiconductor manufacturing, engineers and process managers try to make decisions quickly. Any deviation from the normal manufacturing process may require a decision about the associated product. A low-yielding lot of wafers or die may indicate a potential manufacturing problem within the process. To identify the manufacturing problem, data needs to be accessed in a consolidated way. In semiconductor manufacturing, where multiple sub-process steps are required to complete the product, deviations from any of these sub-processes may cause a failure in the overall manufactured product. Therefore, different product, process and design engineers each need access to data to make a determination as to the cause of failure for the product and thereby prevent the failure from happening again.

Figure 1:
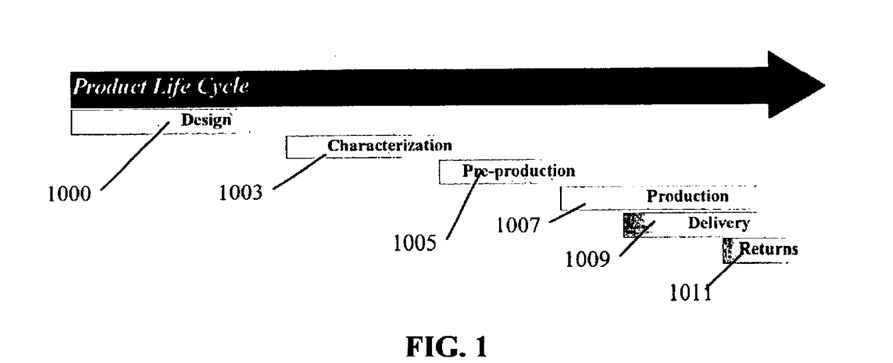
FIG. 1 is a diagram illustrating a semiconductor product life cycle.

The success of a fabless company is largely determined by how quickly it can deliver a yielding product to market. The product lifecycle typically involves design 1001, characterization 1003, pre-production 1005, production 1007 and delivery 1009 as shown in FIG. 1. Device characterization takes place early in a product's life cycle preceding high-volume manufacturing to verify its performance to specifications and manufacturability.

The characterization 1003 and pre-production 1005 phases of a product life cycle can last from 3–6 months and are necessary to determine if a device can be manufactured profitably. The analysis performed during this time allows a company to quantify the tradeoff between manufacturing yield and performance which sets target yields, number of WIP starts, and necessary inventory levels.

There are three important outcomes of characterization testing 1003: First, the design is verified over all combinations of the operating conditions it may encounter once placed into operation. This testing helps identify design issues and develop insight into a device's dependencies on voltage, temperature, and frequency. Second, manufacturing variability can have a significant impact on device performance. Testing is performed over a range of guaranteed manufacturing process settings to reveal how yield changes as key performance metrics of the manufacturing process drift within the guaranteed range. Finally, as a consequence of the first two outcomes, characterization testing validates the production test program and helps determine production test limits, which are the pass/fail limits used in production testing.

Each of these outcomes are typically achieved from the same 3 to 5 lots of data collected at final test.

Figure 2:
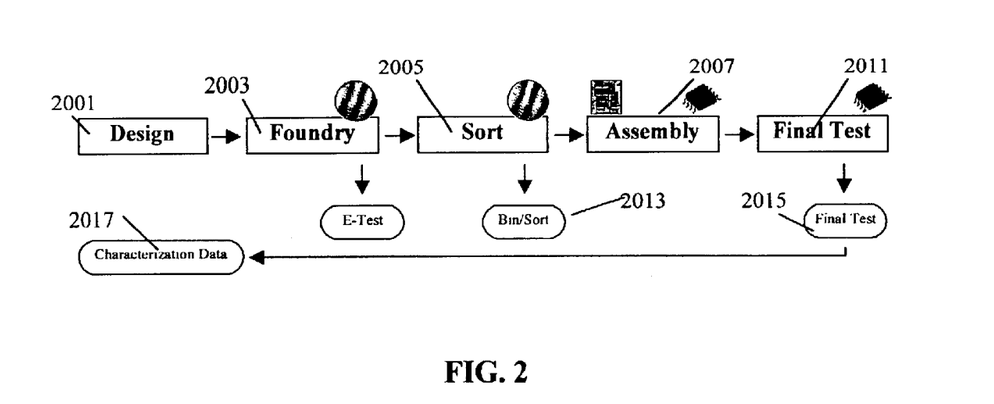
FIG. 2 illustrates semiconductor manufacturing flow with data types.

FIG. 2 is a high-level view of the flow of a product through design 2001, manufacturing 2003, sort 2005, assembly 2007, and final test 2011.

During normal production, data collected at final test 2011 is largely dominated by pass/fail information. Once test limits are established, the primary interest is if a part passes or fails a particular test. The objective is to pass or fail the part as quickly as possible. For device characterization, higher levels of detail are collected for each test applied to the part. To support characterization analysis the platform of the present invention loads a wide range of data types, including pass/fail, parametric measurements, test limit values, and test conditions.

Prior to the present invention platforms primarily focused on lot, wafer, die, and site level data. The present invention adds final test and characterization capabilities. With the addition of final test and characterization capabilities, the present invention extends data model, selection, and analysis capabilities to include part, pin, test, and test condition.

Figure 3:
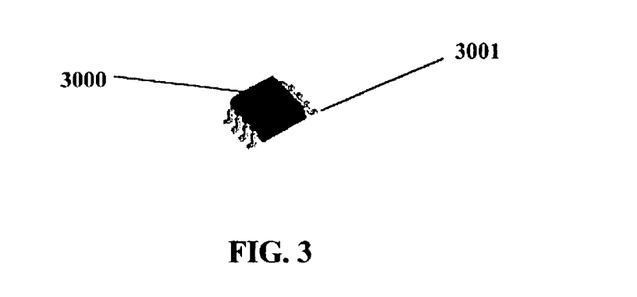
FIG. 3 illustrates a packaged semiconductor part to which the system of the present invention is advantageously applied.

A "part" 3000 is a packaged die as shown in FIG. 3; which is the actual product sold. Each part 3000 may have any where from 3 to 400 or more pins 3001.

A "pin" 3001 is the electrical connection point for the part to a circuit board.

A "test" determines a part's measured output to a specific input. A test may apply at the pin level or at the part level. The output is compared to a test limit and the part either passes or fails.

A "test condition" refers to the environment a part is subjected to when it is tested. Typical conditions include power supply voltage (e.g., Vcc measured over a range in volts), frequency (e.g., clock frequency measured over a range in Hz), and temperature (e.g., temperature measured over a range in ° C.).

Conditions may also refer to the manufacturing environment. To develop insight into the effect of manufacturing variation, fabrication experiments may be performed on characterization lots to explore how parts behave when fabricated within the bounds of the normal process variations expected during manufacturing.

The present invention provides a comprehensive data management, reporting and collaboration system. It integrates with existing information technology to collect and distribute semiconductor manufacturing information from a single scalable data server. The system of the present invention may be Internet or world-wide web based so that users around the world can access data and collaborate on solutions in real time, or it can be network based on a local area network LAN or wide area network WAN to permit use in an integrated facility or with a proprietary network between several locations.

Figure 4:
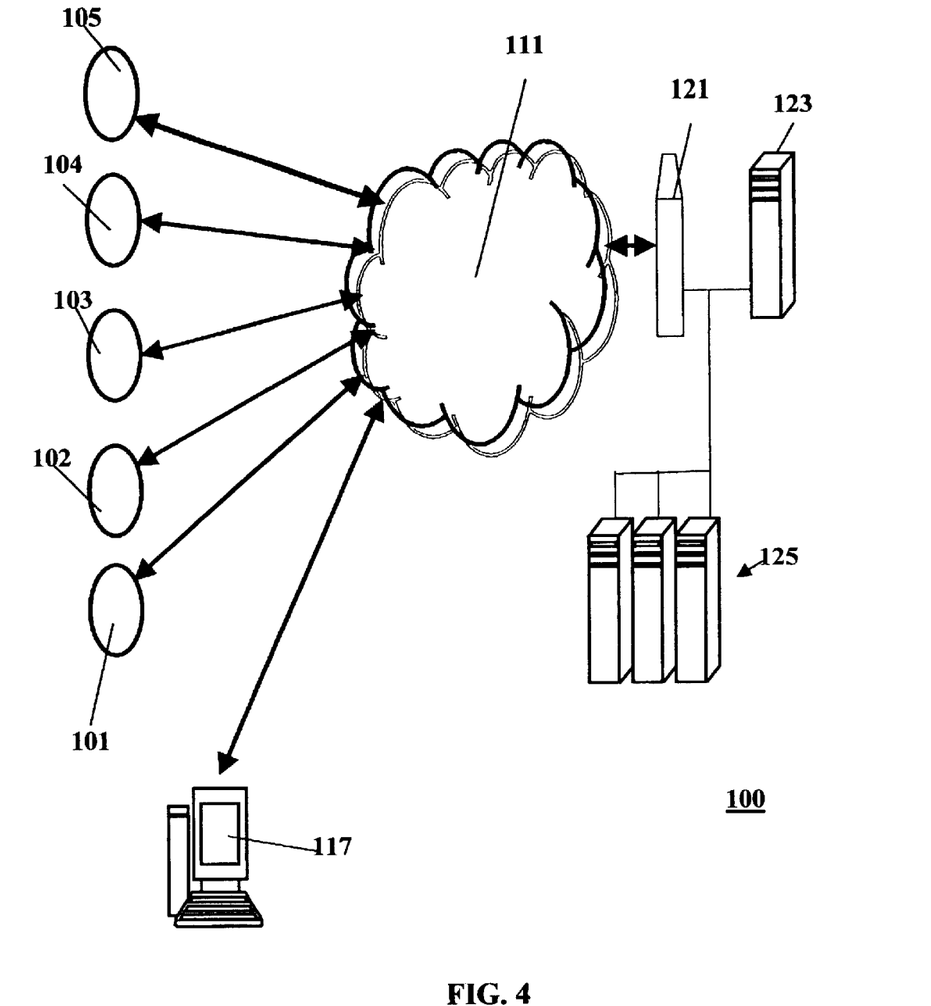
FIG. 4 is a block diagram of a system in accordance with the invention.

Turning now to FIG. 4, the system 100 of the present invention is shown. System 100 includes a server 123 and a database 125 coupled to firewall 121. Although only one server is shown, it will be understood by those skilled in the art that one or more physical servers may be used to provide server 123. Server 123 may be a commercially available server. Database 125 may similarly comprise a plurality of physical databases, all of which are accessible via server 123. Database 125 may be accessed via server 123. Server 123 is coupled to network 111 which in the illustrative embodiment shown is the worldwide web of computers commonly referred to as the Internet. Also coupled to Internet 111 are data sources 101, 102, 103, 104, 105. Various workstations or computer devices 117 are also coupleable to Internet 111. A firewall 121 is utilized to protect server 123 and database 125. Firewall 121 may be any commercially available firewall.

Figure 5:
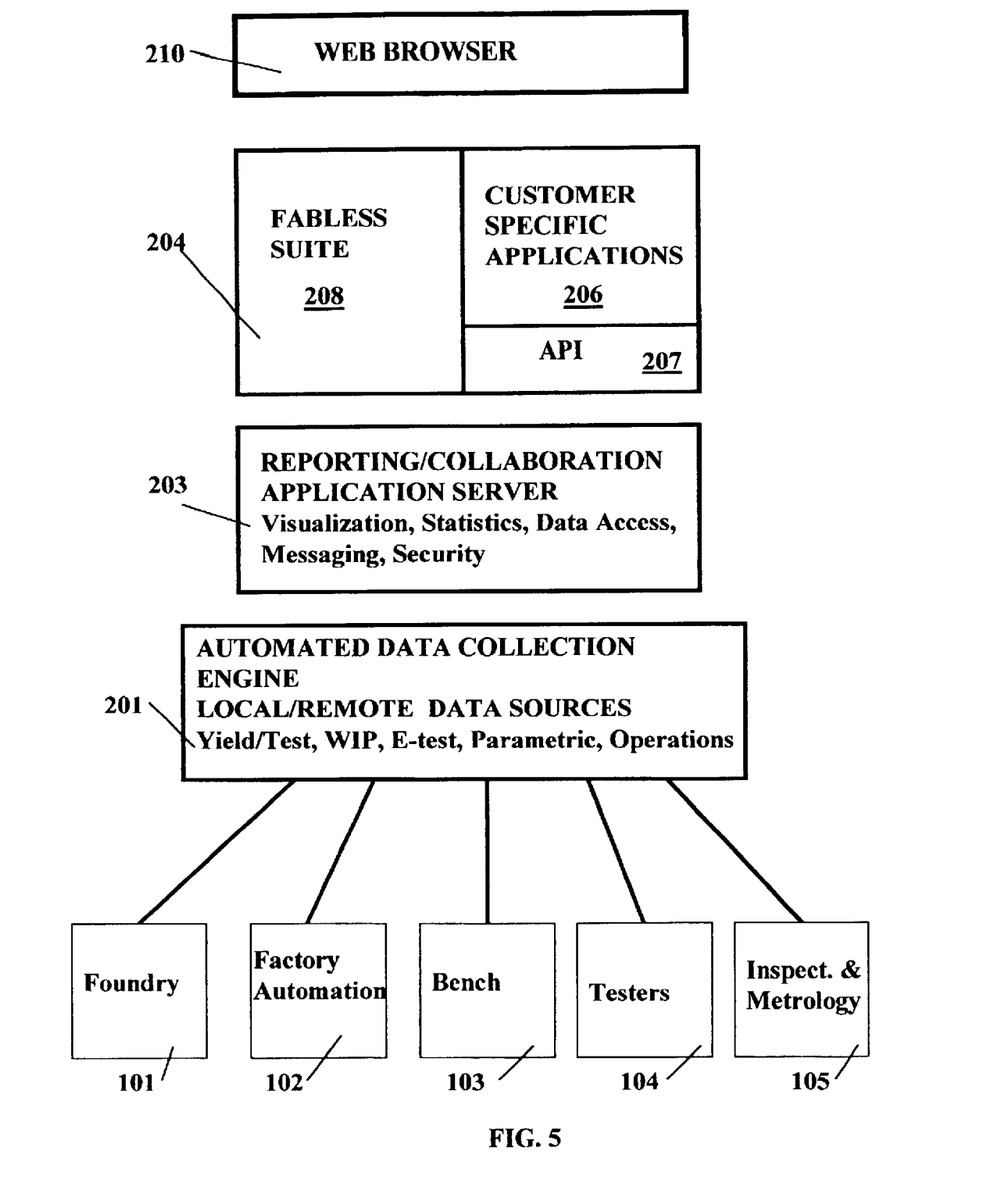
FIG. 5 is a platform diagram of the system of the invention.

Turning now to FIG. 5, the various data sources 101, 102, 103, 104, 105 include a semiconductor foundry 101, factory automation computers 102, bench analyzers 103, various testers 104 and inspection and metrology devices 105. Each of the data sources 101, 102, 103, 104, 105 may be located locally with server 123 and database 125, or may be geographically remote therefrom. Each data source 101, 102, 103, 104, 105 provides either yield/test data, WIP data, e-test data, parametric data and/or operations data to Server 123.

Server 123 includes an automated data collection engine 201 to collect data from data sources 101, 102, 103, 104, 105. Engine 201 is provided with a URL or ftp site or directory(location of files) for each of the various sources 101, 102, 103, 104, 105. Additionally, an engineer or other user accessing the system and method of the present invention need only be provided with a URL through which they may interface via a portal to software engine 201 via server 123. The retrieved data is stored in database 125. Data collection is performed via Internet 111 by information exchanges between server 123 and data sources 101, 102, 103, 104, 105.

An engineer or other user of the system 100 of the invention may access database 125 utilizing a network accessing device 117 such as a computer or other device that may access the Internet 111.

Each device 117 in the illustrative embodiment includes a "web browser" 210 which may be a commercially available browser such as Internet Explorer or Netscape.

Server 123 hosts a platform 203 that provides a reporting/collaboration application server that provides visualization, statistics, data access, messaging and security. Platform 123 is structured as an N-tier, scalable platform. By way of example, platform 123 may employ Unix/Linux.

Server 123 also hosts an application suite that includes an applications platform 204 that includes a suite of applications 205 in accordance with the invention, customer specific applications 206 and API 207.

System 100 is capable of providing a large degree of reporting and analysis, but its basic function is to provide a consolidated view to a user via device 117. Server 123 integrates data and reports collected by engine 201 from data sources 101, 102, 103, 104, 105. Server 123 utilizing software platform 204 integrates selected data and reports in response to requests initiated at user device 117 and received via Internet 111. Server 123 outputs the integrated data and reports via Internet 111 to user device 117 for display to a user. This has the advantage of providing an engineer or operator or other decision-maker a unified, consistent user interface. Each user of system 100 accessing server 123 via Internet 111 does not need to worry about how the data is transferred from data sources 101, 102, 103, 104, 105 to Server 123 and database 125 since system 100 automatically obtains the data.

System 100 provides visual and analytical tools to research design and manufacturing problems that arise subsequent to design and through production. Reporting/collaboration application server 203 provides software tools to perform the following analysis: descriptive statistics; ANOVA; Cp/Cpk; F test; T test; correlation analysis; factorial analysis/principle components; and lot/equipment commonality analysis.

System 100 provides to a user at a device 117 reports that are particularly useful in a semiconductor-manufacturing environment. The reports enable users to perform the following spatial analysis for both electrical test (PCM) and wafer sort (WAT) data: single wafer map; composite map; 200, 300 mm wafer maps; wafer map gallery (multiple wafer maps), bin to parametric wafer map comparison; systematic & random yield calculation (Ys/Yr); row/column analysis; quadrant analysis; interactive wafer map manipulation; and display of site and die locations.

System 100 enables users to create charts and graphs of any data type. Charts and graphs that may be provided include: line trend, histogram; histogram gallery; box plot; box plot gallery; Pareto; Cp/Cpk trend; Schmoo; scatter & regression plots with fitting; and control charts (x bar r, x bar s).

System 100 provides an interactive editor that enables users to create split lot definitions. The split lot definitions can be applied to different analyses supplied by the platform to study variation across splits.

As described above, each user interacts with the system 100 from a workstation or other network access device or Internet device 117 using a standard web browser 210. The platform of system 100 does not require any specialized software to be installed at device 117 other than a commercially available web browser thereby advantageously reducing overall IT installation and support costs.

System 100 lets a user at device 117 "surf" live data interactively, moving freely between lot, wafer or die-level data while capturing key information or analysis at each step. The user does not need to know which data to "extract" before analyzing a problem. System 100 performs analysis directly against database 125, allowing a user at device 117 to modify a search in real time and to obtain answers more quickly. Users select data and then navigate and analyze data by clicking on data points or other features of interest displayed on a display included at device 117.

Server 123 also caches all analyses performed by users to enable all users to share the results with their team.

The suite of programs 204 includes a web content management and publication engine. The engine enables users to create custom reports for publication using the results of user-initiated analysis. All published reports may be annotated by users and converted into a variety of formats, such as Adobe PDF, for publication. System 100 provides an open API for customization.

The present invention provides an important advantage over prior art systems in that system 100 collects raw data and maintains relationships associated with the different raw data files. System 100 serves as a portal to allow data from many diverse data collection systems 101, 102, 103, 104, 105 to be seamlessly integrated into one user interface.

Figure 6:
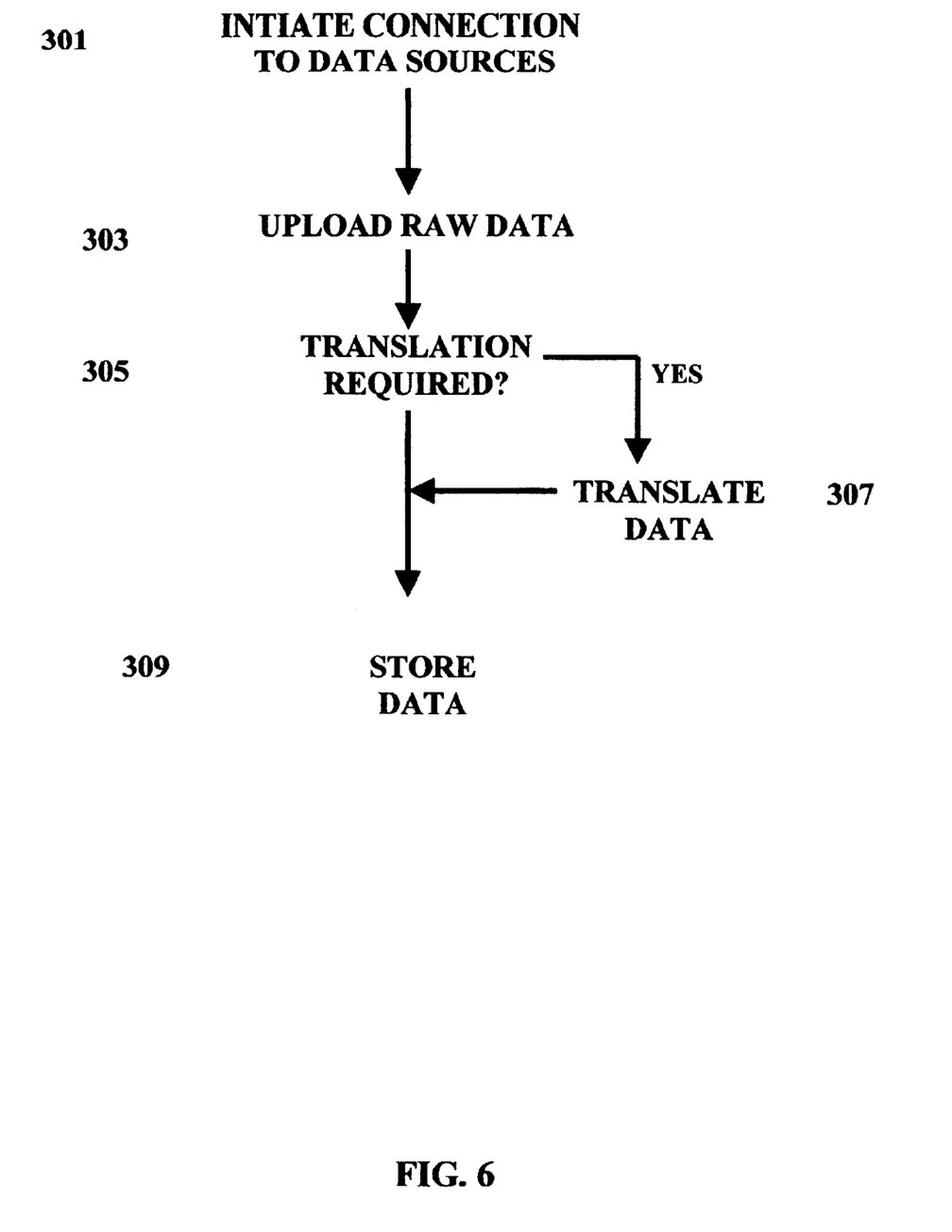
FIG. 6 is a flow diagram.

The process associated with the method of the present invention is illustrated in the flow chart provided in FIG. 6. In step 301, automated data collection engine 201 at server 123 initiates a connection to a data source 101, 102, 103, 104, 105. Raw data is collected from a metrology tool or as a process variable at the data source at step 303. Automated data collection engine 201 determines whether the raw data requires translation or not at step 305. Depending on the nature of the raw data as determined by the data source 101, 102, 103, 104, 105, the data may be subjected to translation at step 307 prior to being stored at step 309 in database 123. If engine 201 determines at step 305 that the data does not need translation, the data is stored directly in database 123. The translation may involve either the extraction of relationship information, which in turn is stored within database 123, or the data may be managed and translated and stored directly in database 123. A pointer or flag may be associated with the data as to where the actual raw data is located in the database.

Data collection engine 201 automatically detects when new data has arrived. The configuration of the data collection source may determine whether or not this data is then in turn stored within a database or data file structure 125. When software engine 201 is coupled to a data source 101, 102, 103, 104, 105 engine 201 monitors the data source 101, 102, 103, 104, 105. If the data source is a database, the database is polled for data on a recurring basis. If the database is a file created by measurement equipment, then software engine 201 monitors and sets up directories for those type files and automatically loads the files into database 125. Engine 201 is network or web based. As such, it is completely platform independent and merely requires that user device 117 is operable on the network 111 used. Therefore, a user would be able to access data with appropriate permissions from any place in the world. This is particularly valuable for dispersed manufacturing systems where semiconductors may be produced at a foundry in a country such as Taiwan, tested in Hong Kong and ultimately assembled in the United States or where the engineers overseeing the process are located in a remote facility.

Figure 7:
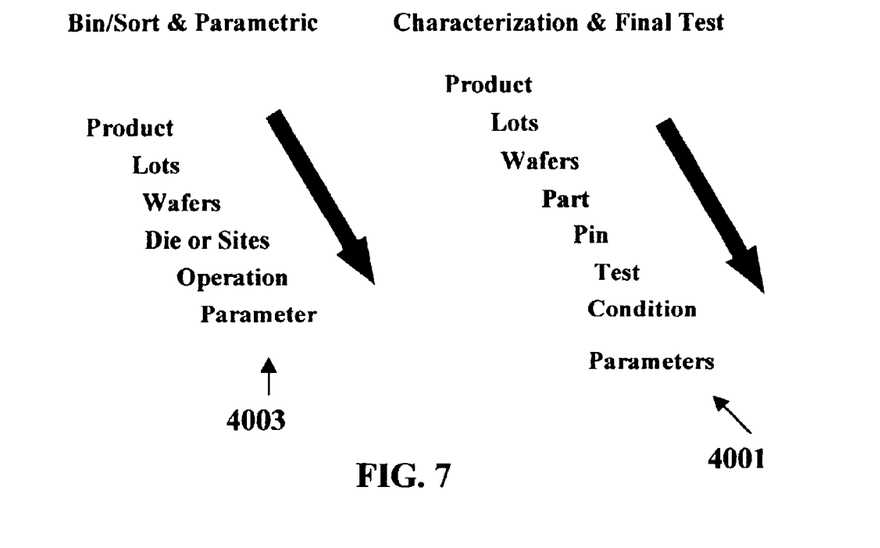
FIG. 7 is a comparison of data hierarchies.

FIG. 7 compares the data hierarchy for characterization and final test 4001 to that for bin/sort and parametric 4003.

The present invention provides a number of standard reports.

Figure 8:
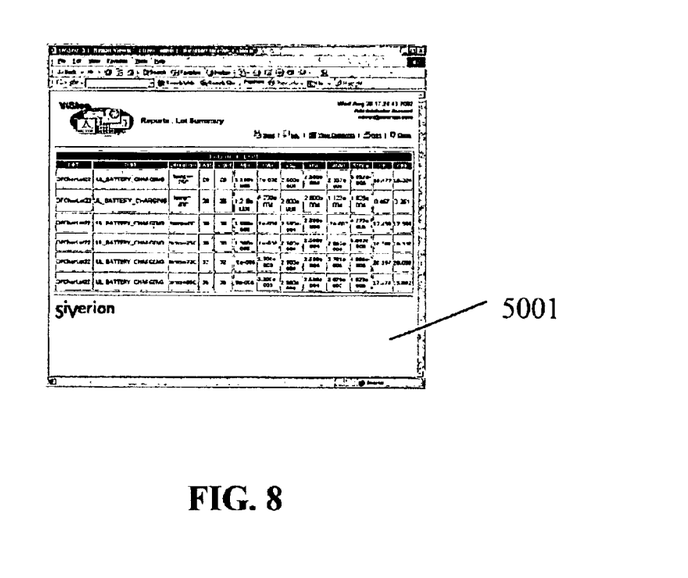
FIG. 8 is a workstation screen display of a lot summary report for a characterization module in accordance with the invention.

Summary reports 5001 are provided for each data level as shown in FIG. 8. These reports 5001 are similar in behavior to parametric summary detail reports. The characterization module supports summary reports for lot, part, and pin. Each report displays summary statistics, max, min, mean, StDev, count, number passing, number failing, Yield, Cp, Cpk, and the test limits. Reports may be grouped by test and condition.

In addition to summary reports, the characterization module provides boxplots, histogram, and a test comparison boxplot. These reports are derived directly from versions currently available in the parametric module.

The characterization module provides analysis by device pin including pin failure pareto charts, boxplots, histograms, and pin comparison boxplots. These reports are derived from their counterparts in the bin/sort and parametric modules.

Along with the summaries by condition, the characterization module provides boxplots, histograms, probability plots, scatter plots, and galleries of part and test measurement by condition. These reports are derived from their counterparts in the parametric module.

A comprehensive characterization report completely summarizes the selected data in terms of lots, parts, pins, tests, and conditions. A report navigation page, allows a user to jump directly to different sections of the report. All pages within the comprehensive report are highly linked enabling drilldowns into greater levels of detail.

All reports available from the characterization data selector may be included in the comprehensive report, by the user.

The characterization module provides the capability to correlate test data to parametric data at the lowest level of aggregation supported by the data set. For instance, if the characterization test data contains lot-level traceability only then lot-level correlation to E-Test and Sort will only be supported. If die-level traceability is supported by a characterization dataset then correlation to lot, wafer, site, and die for E-Test and Sort is supported.

Reports for the characterization module are largely based on those available in the Parametric Module. The primary differences are found in how data is grouped. Characterization brings with it additional levels for grouping, including, test run, part, pin, and parameter.

Boxplots created by the characterization module will have the following display components: title bar, header, popup box summaries, display test limits, drilldowns, and color fills.

Characterization boxplots may be grouped by: lot; wafer (if known); part; pin; test; condition; and parameter.

Boxplots will automatically fold if the number of boxes is greater than a predetermined number, which is selected to be 50, in the illustrative embodiment. A Boxplot will attempt not to fold in the middle of a condition set. Other conditions are that the y-axis span will be the same for all folded boxplots; and x-axis labels are not skipped.

The system provides comparison boxplots

Histograms displayed by the characterization module have the same display capabilities as the parametric module histograms including: title bar; header; summary table; display test limits; drilldowns; color fills for bars with data outside limits. Histogram bin count may be set by the user.

Characterization histograms may be grouped by: lot; wafer (if known); pin; test; and condition.

The system provides histogram galleries that support the same capabilities as are available for parametric histogram galleries. Parameters are displayed across columns and rows will be lot, wafer, part, or condition depending on the users "group by" selection The system provides probability plots. The probability plots are created by the characterization module and have the same display components as parametric module probability plots: title bar; header; popup box summaries; display test limits; drilldowns; and color fills.

Characterization probability plots may be grouped by: lot; wafer (if known); pin; test; or condition.

Grouping may be displayed on separate probability plots or grouping may be displayed on a single plot with individual data sets will be distinguished by color and/or by symbol.

The system provide correlation reports including scatter plots and correlation tables.

The system provides a comprehensive characterization report.

The system of the invention provides a new graphical tool know as a Shmoo Plot. Shmoo plotting is used for characterization analysis to help the product engineer visualize the performance behavior of a device. The Shmoo plot shows whether the device passed or failed as a function of various combinations of environmental conditions (e.g., temperature, voltage, or frequency) or pin parameters applied to it.

Figure 9:
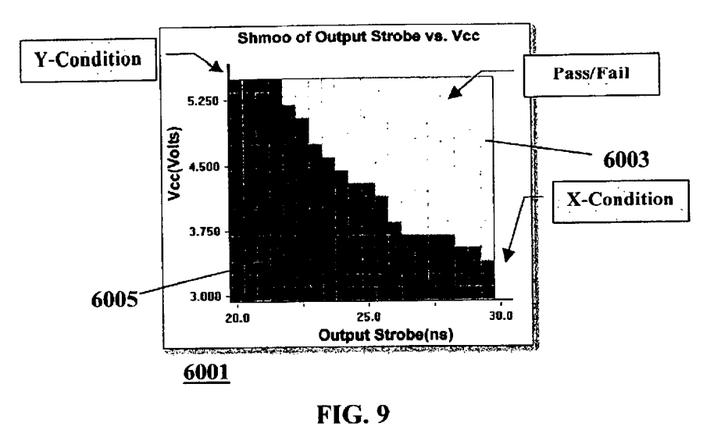
FIG. 9 illustrates a screen display of a Shmoo plot.

The concept is to "Shmoo" a parameter across a defined range to see how the part performs. For example, to see how power starvation affects device performance a product engineer may Shmoo input strobe (20 ns to 30 ns by 0.5 ns) vs. Vcc (3.0V to 5.0V by 0.15V). The Shmoo plot 6001 of this test or series of tests is shown in FIG. 9. Each filled square on the plot represents one complete run of all functional test vectors used by the selected test or tests; the light gray colored squares 6003 indicates the part passed and black squares 6005 means the part failed the test vector.

Figure 10:
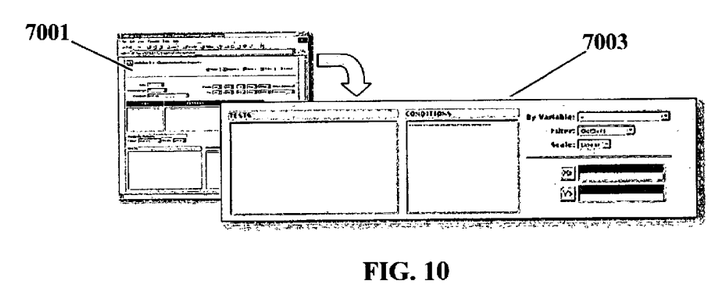
FIG. 10 illustrates screen displays of a characterization data selector for a Shmoo plot.

To create a Shmoo plot, a product or device engineer selects tests, pins, or groups of pins from a "part" data selector 7001 as shown in FIG. 10. At least two Shmoo conditions must be selected and assigned to an axis on the Shmoo plot. The condition selection mode is similar to that for correlation and scatter plots on the parametric data selector: if more than two conditions are selected multiple Shmoo plots will be created. For example, voltage and temperature are assigned to the y-Axis and frequency is assigned to the x-Axis, two plots will be created with voltage and frequency and another with temperature and frequency. The assignment is made using window 7003.

To create a Shmoo plot, test limits must exist for the test and pin parameters selected.

The characterization module displays two types of Shmoo plots- a pass/fail Shmoo and a composite pass/fail Shmoo plot.

The pass/fail Shmoo plot shows the pass/fail status of a test for the x-y combination of the conditions displayed on the plot. The user may specify the colors used to differentiate pass/fail. Each cell of the Shmoo plot optionally displays a configurable character, e.g, P for pass and F for fail, to support monochrome printing.

The pass/fail Shmoo Plot is the default plot when the "group by" variable is "part" for any combination of tests, parameters, or groups of parameters. If more than one part is selected then a Shmoo plot will be created for each part.

Each x-y condition cell supports a drilldown to a summary of the test vector including test number, test name, conditions, test measurement, and test limits.

The composite pass/fail Shmoo calculates and displays the proportion of selected parts with passing values for each passing x-y condition combination. This is the default plot when the "group by" variable is either "lot" or "test run" for any combination of tests, parameters, or groups of parameters.

Figure 11:
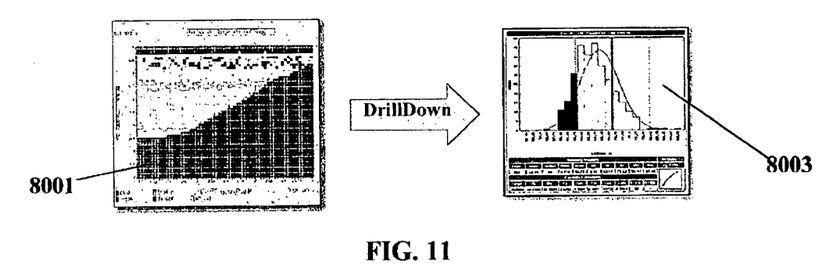
FIG. 11 illustrates screen displays of a Shmoo plot drill-down.

Drilling in on any cell of a composite Shmoo plot 8001 displays a description of the test and a histogram gallery 8003 of test parameter values and test limits for the parts included.

The characterization module is able to create a pass/fail Shmoo plot and a composite Shmoo plot. The default plot is a pass/fail Shmoo plot when the "group by" variable is "PART". The pass/fail test for a part will be displayed at each x-condition/y-condition combination and the test pass/fail will be calculated by the system against test limits.

The default plot is a composite Shmoo plot when the "group by" variable is "lot" or "test run". The percentage pass will be displayed at each x-condition/y-condition combination and is calculated by the system against test limits using the selected parts.

System 100 provides an interface for selecting tests and conditions for a Shmoo plot. All capabilities for data selection provided by the characterization data selector including data selection, filtering, and scaling are used. The Shmoo plot may be saved. The user selects a test (a grouping of parameters) from the characterization data selector to plot as pass/fail. A Shmoo plot is created for each test selected by the user. The user selects at least two test conditions from the characterization data selector as the x-Axis and y-Axis of the Shmoo plot. The user assigns one or more conditions to the x-Axis of the Shmoo plot and may assign one or more conditions to the y-axis of the Shmoo plot. Shmoo plots are created for each unique x-y pair of selected conditions. If conditions are not assigned to the x and y axes then all combinations of x-y pairings are created.

System 100 provides a mechanism to assign colors to the Shmoo plot. Users may assign colors to passing and failing parts, tests, parameters, or groups of parameters. The default color for passing tests is green. The default color for failing tests is red. Users may define a color gradient to a gradient Shmoo. The user may define a color map to composite pass/fail Shmoo plots.

System 100 calculates pass/fail for tests to be plotted on a Shmoo plot. A two-sided test will pass if LSL<Test Value<USL and fail otherwise. A lower, one-sided test will pass if LSL<parameter value and fail otherwise. An upper, one-sided test will pass if parameter value<USL and fail otherwise. The system calculate percentage pass for composite pass/fail Shmoo plots.

The Shmoo plots support drilling down on an x-condition/y-condition value in the Shmoo plot to display a test, parameter, or parameter group summary as shown in FIG. 11. The test summary includes: test number; test name; test units; tester; test date; test limits; measured value; test pass/fail status; and comments.

Drilling down on an x-condition y-condition value in a composite Shmoo plot displays both a histogram and a summary of the composite level, i.e., parts, tests, parameters, or parameter group. For a composite Shmoo plot the test summary includes: count; Cp/Cpk; and yield.

For a composite Shmoo plot the histogram uses the measured values for the test. The histogram will display test limits. Histogram bins with values falling outside the test limits are displayed in red. Histogram bins with values falling inside the test limits are displayed in green. Drilling into the histogram will display a part summary for the condition pair and parts included in the histogram.

Figure 12:
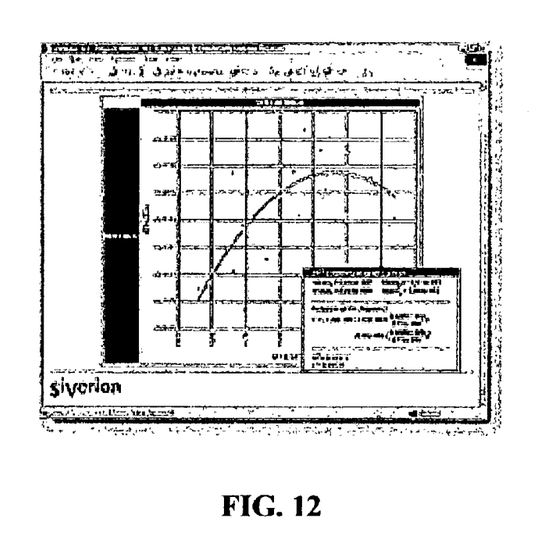
FIG. 12 is a screen display of an adaptation of a parametric scatter plot to support parameter derating.

Parameter derating allows a product engineer to interpolate values for a parameter across test conditions such as temperature, voltage, frequency, or process corners. For example, a derating factor may be used to indicate how much the voltage applied to a part must be decreased for an increase in ambient temperature. The present invention includes a derating tool to estimate derating factors across test or process conditions. Capabilities provided to support parameter derating include: scatter plot to plot test parameters across conditions and polynomial regression to provide coefficients with parameter significance estimates and confidence bounds on estimates using a regression model. Derating curves and factors are considered to be an attribute of the parameter and may be saved with the parameter in the database. FIG. 12 illustrates the adaptation of a parametric scatter plot to support parameter derating.

System 100 estimates derating functions for test parameters (part and pin) across conditions. The system uses linear, least squares regression to estimate the derating function and calculates total Sum of Squares (SST), Sum of Squares for Regression (SSR), Sum of Squares for Error (SSE), Regression Mean Square (MSR), and Error Mean Square (MSE) for the regression. The system also calculates the parameter estimates for the regression function; the significances for the regression function parameters; and prediction intervals for the regression function.

The derating function is displayed on a scatter plot with the data used to estimate the function parameters. On the display, the x-axis will be the condition values and the y-axis will be the test parameter. Values that are determined to be outlying by Cook's D are displayed in red. Values not determined to be outliers are displayed in green. The derating function is drawn in black over the range of the data. Derating function parameter estimates and confidence intervals are displayed in a table with the scatter plot.

The user may specify a value for the condition variable, x-value, and the system uses the derating function to estimate a value for the test parameter, y-value. A 95% confidence interval for the test parameter estimate will be calculated and displayed with the estimate The derating functions for any number of condition may be saved as an attribute of the test parameter. The ranges for the test parameter and conditions are saved with the derating function.

A user is able to limit searches by date and time interval and apply filtering and scaling options to data. Data selection capabilities provided include: wafer level tracking and selection; select test≧pin≧parameter; and select a single condition-level from a list of conditions.

The data selector has the ability of defining one or more WHERE clauses that serve to exclude parts from analysis based on part attributes loaded into the system database. Examples might be: don't include parts that were tested on tester TP1 or don't include parts where CONTINUITY is 0.

A "part split editor" allows a user to assign parts or groups of parts to specific splits. The ability to tie a part split back to a split lot defined in Bin/Sort or Parametric is also provided.

Figure 14:
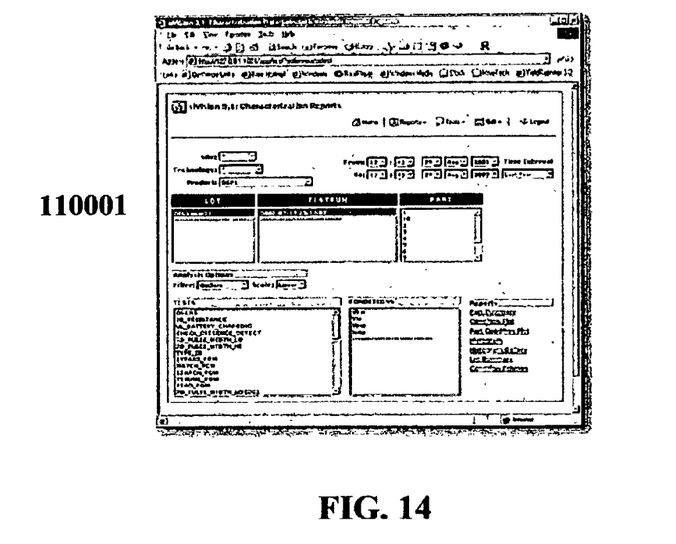
FIG. 14 Prototype of Characterization Data Selector

Characterization Data Selector 110001 shown in FIG. 14 provides a function editor allowing a user to define a function that convolutes tests, parameters, or conditions creating a new calculated parameter. The new calculated parameter can be saved and included in the list of tests or conditions.

Figure 13:
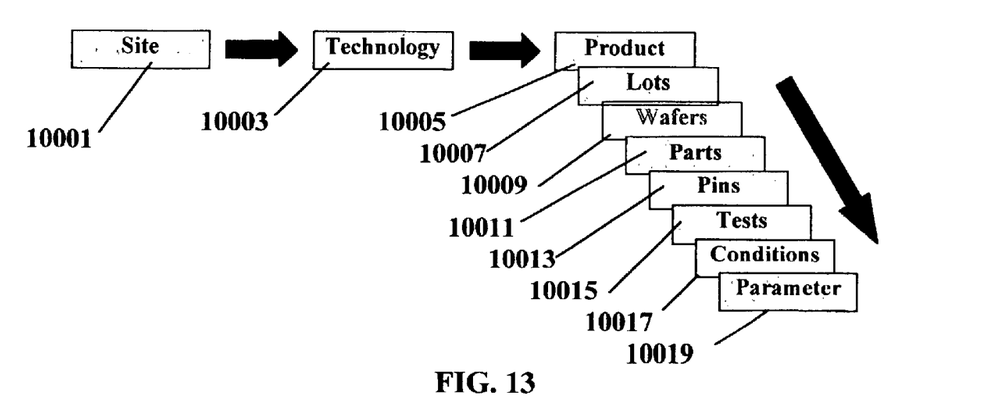
FIG. 13 illustrates a characterization data selection hierarchy.

As shown in FIG. 13, with characterization data selector 110001 the user is able to select a fab 10001, a technology 10003, and a product 10005. The user may for the selected product then select a lot 10007, a wafer 10009, a part 10011, pins 10013, tests 10015, specific test conditions 10017, and specific parameters 10019.

The user is able to select individual DC and AC tests for analysis, individual test conditions, selection of a condition group, e.g., all temperatures for a condition; and selection of an individual test condition, e.g., where Temperature=25° C.

System 100 includes the ability to apply a WHERE clause to parameters, such as "WHERE continuity=1"; and "WHERE yield>75% AND yield<25%".

System 100 provides enhanced limit editing to support the needs of characterization. A limits editor allows engineers to view, change, and add comments to one or more test or parameter limits. The limit history may also be viewed. Limits may be saved as a named limit set for personal use at a later date. A limit set saved by a system user may be private or may be shared with other system users. A user designated as a "super user" may save a limit set as the system limits.

A unique capability provided by the system is a "GenLimits" function that has the system automatically generate a set of limits from data for selected parameters. GenLimits uses a Boxplot criterion to estimate limits from data:

$$USL=Q3+1.5 \times IQR+(\text{LimitPad} \times \text{Median})$$

$$LSL=Q1-1.5 \times IQR-(\text{LimitPad} \times \text{Median}),$$

where, Q1 is the $1^{st}$ quartile of the data selected for estimation, Q3 is the $3^{rd}$ quartile, IQR is the interquartile range, and LimitPad is a factor≧0.

Users of the parameter attributes editor can edit the following parameter attributes: parameter name; alias; units; measurement type; good bins; function (which may be a calculated value based on data contained in other parameters); operation; TGT (target); LSL (lower specification limit); USL (upper specification limit); LCL (lower control limit); UCL (upper control limit); LPL (lower plot limit); UPL (upper plot limit); LRL (lower reject limit); URL (upper reject limit); and comment.

System 100 recognizes one set of limits as system limits. Users may have any number of saved limits and limits will be saved by name. Only a user identified as a "SUPER USER" or "ADMIN" may edit or save limits as system limits. In addition to other options, a user may view the history of limit changes or updates. The limit history will maintain the name of the person making the change, the change date, and a comment. A user may generate limits for one or more parameters.

Figure 15:
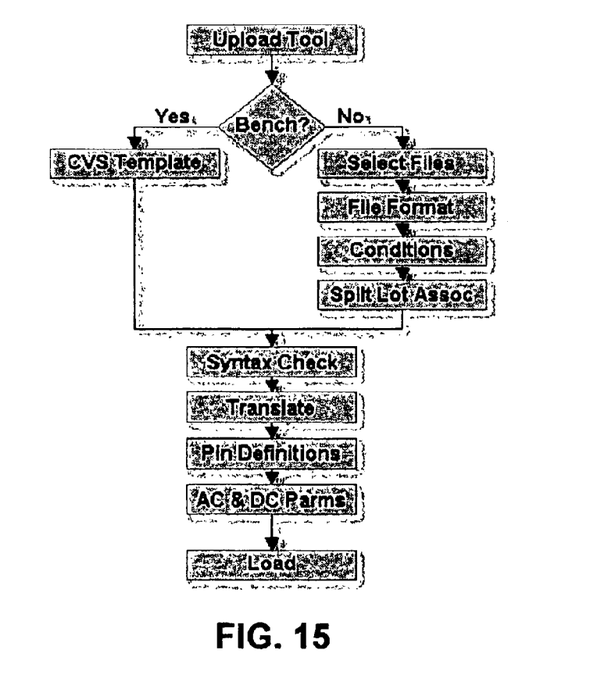
FIG. 15 is a flow diagram.

System 100 provides for default calculations. The default calculation for the upper specification or test limit is: USL= Q3+1.5×IQR+(LimitPad×Median). The default calculation for the lower specification or test limit is LSL=Q1-1.5× IQR-(LimitPad×Median); where Q1 is the $1^{st}$ quartile of the data selected for estimation, Q3 is the $3^{rd}$ quartile, IQR is the interquartile range, and LimitPad is a factor≧0 used for adding additional padding to the calculated limits. The user may specify a function to use for limit calculation The Characterization Module provides an upload tool enabling loading data from a desktop system into the system database for analysis. The upload tool flow is shown in FIG. 15. The upload tool provides a user interface allowing a user to supply all the necessary information required by the system to successfully load a data file including file name, tester type, test conditions site, technology, and product name. The characterization module will support both testerformatted data or "bench" data. A utility is provided to help the user format "bench" (i e., hand collected & written) as a CVS file for loading. Characterization data may be automatically loaded using a loader. The characterization module provides a UI enabling a SUPER USER (for database protection) to upload data from a desktop or other client system. The user must provide the path and filename of the file to upload and the name of a file format. The user may provide: test conditions if not included in the file and pin names for pin-level tests. The user may define test parameters as AC or DC test parameters. The user may also provide a Site (or manufacturing location), Technology, and Product. The user may further select either "characterization" or "bench" as the operation. If bench is the operation, the user provides a CSV file containing the data. An Excel™ template is used to allow the user to correctly format the data for uploading.

System 100 displays the upload and translation status. The system validates the WMP file and reports the result to the user. If the file fails validation the reason will be reported to the user. The system will only attempt to load a validated WMP file and report the progress to the user. The system has a file size limit for uploads and warns a user about too large a file at file validation time. The file size limit is maintained by an ADMIN. The user has the option to archive the data on the server.

Validation of test limits is an important aspect of device characterization. Devices with test measurements falling outside limits can either be classified as failed or grouped with less-profitable parts. The selection of test limits is important because it impacts product yield, performance, competitive positioning, system performance, system cost, functionality, and profitability.

Figure 16:
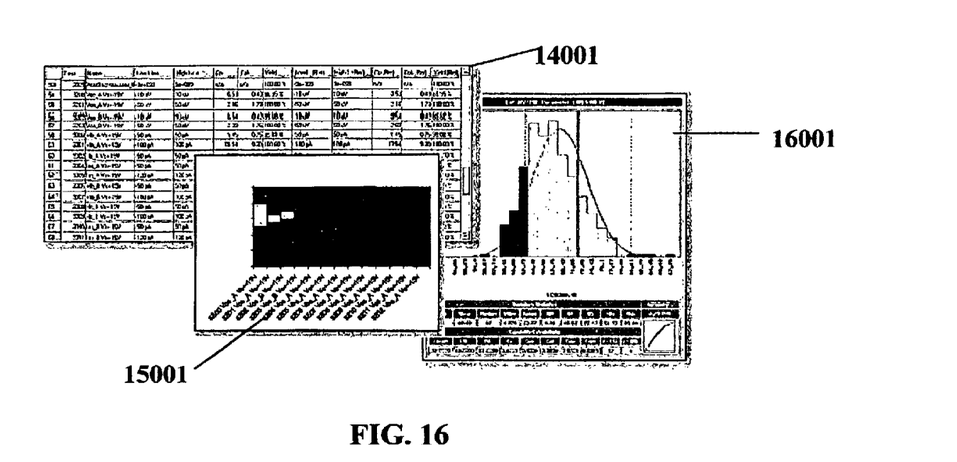
FIG. 16 illustrates the relationship of screen displays for one module.

A "WhatIF" module 13000 shown in FIG. 16 provides a highly interactive, table-driven environment allowing product and device engineers to view and modify test and parameter specification limits and then immediately see the effect of the changes on parameter Cpk, parameter Yield and the overall Yield. The WhatIF module 13000 includes three primary visual components. The main UI component is a WhatIf edit table 14001, shown in more detail in FIG. 17, that contains, by default, columns containing Test Number, Test Name, Low Limit, High Limit, Cp, Cpk, Yield, $Yield_R$, $Low\ Limit_R$, $High\ Limit_R$, $Cp_R$, and $Cpk_R$. An additional display column contains a histogram thumbnail showing the shape of the distribution of the measured test data and its relationship to the specification limits. For tests with failing devices (Yield<100%), WhatIF colors the test parameter in red. A user may change values for Low Limit and High Limit and then recalculate the table. Immediately, parameter Cp, Cpk, and Yield will be recalculated, including overall yield, and displayed in the table.

Figure 18:
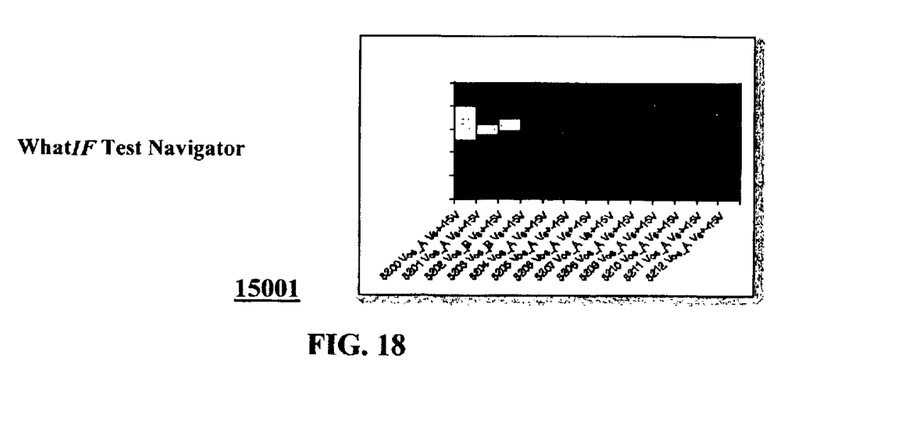
FIG. 18 is a screen display of a test navigator.

The second key UI element is the WhatIF Test Navigator tool 15001, shown in more detail in FIG. 18. This tool displays a stacked bargraph in a window showing the relative pass/fail yield for each test. Any yield changes due to changes in the limits table are shown in yellow. The default order of tests will be by test number. The user can specify an alternative display order and display. A user can single "mouse-click" on any bar in the WhatIF Test Navigator and display a summary of the parameter including test limits, # pass/fail, Cp. Cpk, margin-to-spec, yield statistics, tester, test location, and a test description (if available). Double clicking on a bar will immediately take the user to the test in the WhatIF Edit Table.

Figure 19:
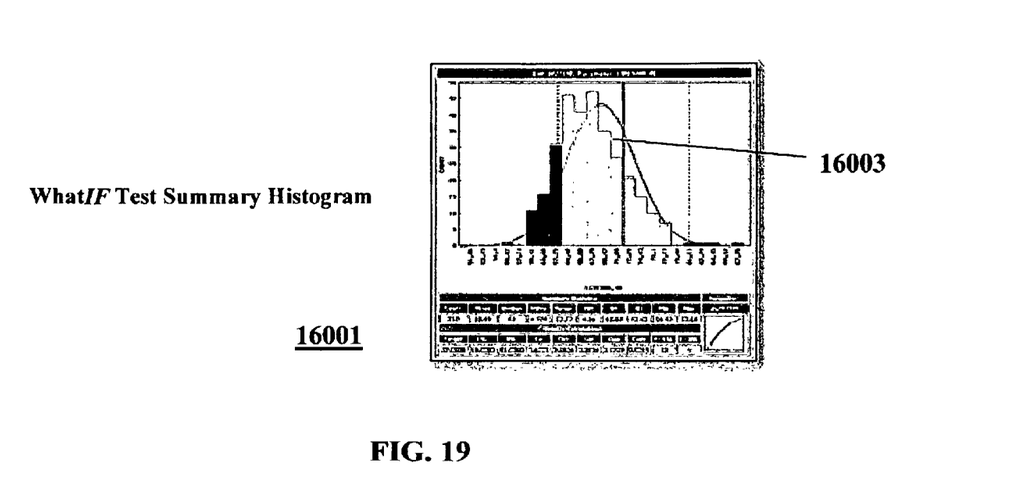
FIG. 19 is a screen display of a test summary histogram.

A third UI element is the WhatIF test summary histogram tool 16001 shown in more detail in FIG. 19. This tool displays in a window a histogram 16003 of test measurements against the test limits. Bars with measurements falling within the test limits will be filled green. Bars with measurements falling outside the test limits will be filled red. Those bars that contain limit changes will be filled in yellow. Like each of the other UI elements, the histogram is interactive. A single "mouse-click" on any bar displays a summary of test measurements falling within that histogram bin. To change a test limit, the user "grabs" a test limit on the histogram (dotted line) and "drag" it to the desired value. The test yield statistics, #pass/fail, Cp, Cpk, and yield) are immediately updated as the limit is moved. The product engineer will click an "Accept Changes" button to send changes back to the WhatIF edit table.

An additional capability provided by WhatIF is the ability to automatically "optimize" test limits. A user selects test limits that can float and constrains other test limits. The WhatIF tool determines the best test limits settings that maximize yield.

The WhatIF module automatically calculates the following statistics for each selected parameter: Cp, Cpk, number failing for each specification limit, number passing for each specification limit, total count, and parameter yield. This module calculates a composite yield for the selected parameters.

WhatIF provides data selection, filtering, and scaling. The user selects and filters data from a selector. The user may select tests, specific test conditions, and specific parts. The user may select parts conditionally, e.g., only functional parts.

The results of the WhatIF analysis may be saved in ReportPortfolio and edited and recalculated by a user and/or viewed.

The user-interface for WhatIF is an editable table. The contents of individual cells may be directly edited and changed by the user. The table is user sort-able by any column. Sort order is based on the data type held by the column. A default sort-order is the test number. Default is user configurable.

The WhatIF table displays the columns shown in Table 1. All reference columns and columns labeled Fixed will not be editable by the user. A user may change columns flagged User Editable. Columns marked as Calculated will contain values calculated by the system and are not editable by the user.

TABLE I

| |
| --- |
| Test Number (Fixed) |
| Test Name (Fixed) |
| LSL (User Editable) |
| USL (User Editable) |
| Parameter Yield (Calculated) |
| Cp (Calculated) |
| Cpk (Calculated) |
| Histogram (Calculated) |
| Number Failing (Calculated) |
| Number Passing (Calculated) |
| Reference Lower Specification Limit ($LSL_R$) |
| Reference Upper Specification Limit ($USL_R$) |
| Reference Parameter Yield ($Yield_R$) |
| Reference Cp ($Cp_R$) |
| Reference Cpk ($Cpk_R$) |

$LSL_R$, and $USL_R$ are taken from parametric or user limits db tables. $Yield_R$, $Cp_R$, and $Cpk_R$ are calculated using $USL_R$ and $LSL_R$. Clicking on the Number Failing column will display a list of failing devices for that parameter. Once a user has changed the LSL or USL for any number of parameters the table may be recalculated. Recalculation changes the contents of all calculated fields (Cp, Cpk, Yield, Histogram, Number Failing, and Number Passing). Recalculation recalculates the composite yield for the table. Table cells changed by the user are colored distinctively. In the illustrative embodiment, changed cells are colored yellow.

Figure 17:
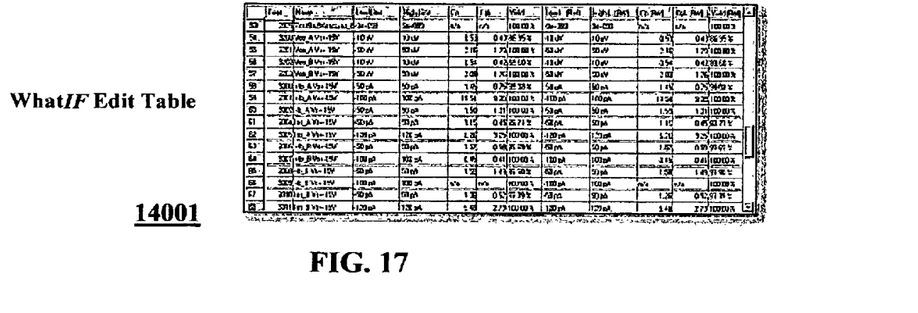
FIG. 17 is a screen display of an edit table.

A table re-calculation is triggered by a "Calculate" button. Cells that change from the calculation will be distinctively colored. In the illustrative embodiment the color used is red. The table UI may be printed, and when printed, all rows will be printed. A histogram thumbnail for each parameter is displayed in the table. Histogram 1601 displays the specifications for each parameter. Histogram bins with data falling out of specification are displayed in a distinctive color which in the illustrative embodiment is red.

A mouse click on histogram 16001 displays a histogram parameter summary popup. A mouse double click on histogram 16001 displays a popup window with a larger version of the histogram. The large view of histogram 16001 allows a user to drag specification limits to new settings. Cp, Cpk, # Pass/Fail, and Yield for the parameter updates as the spec limit is moved by a user. Histogram bars are displayed in one color, green, if the binned data is within the test limits. Histogram bars are displayed in a second color, red, if the binned data falls outside test limits. Histogram bars are displayed in a third color, yellow, if the status of binned data changes due to a user changing the limits.

The WhatIF Test navigator 16001 is displayed as a stacked bar graph. Each bar displays the proportion of failing and passing devices for a given test/condition combination. If test limits are edited by a user, the proportion of newly passing or failing devices is displayed in the bar. Clicking on the bar for a test displays a window containing summary information for the test including the yield statistics, test information, and limits Double clicking on a bar will display the WhatIF edit table and select the test.

Figure 20:
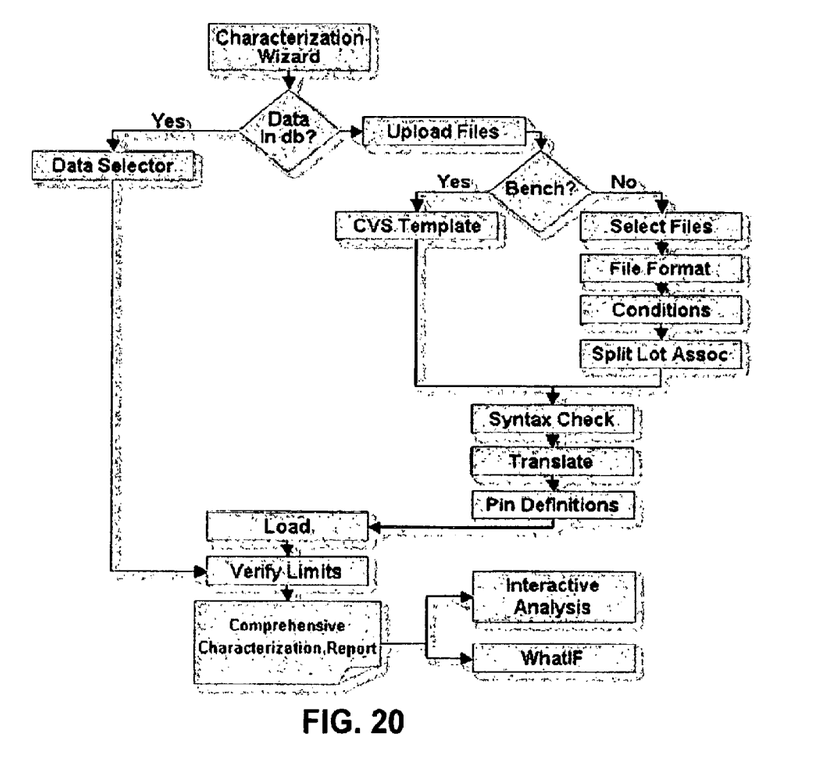
FIG. 20 is a flow chart of a characterization wizard.

The Characterization Wizard, shown as a flow diagram in FIG. 20 leads a user from data upload and selection through the comprehensive characterization report. An "Expert" mode of operation permits a user to select the components of a comprehensive report. The user may select data that is already in the system database. The sequence that occurs includes: displaying the data selector; verifying limits; selecting a named set of limits; editing limits or parameter attributes; selecting components of characterization report; and running the report.

The characterization wizard helps a user upload bench data for analysis. The sequence that occurs includes: prompting path and filename for CSV template containing bench data, checking syntax; translating; defining pins, AC, and DC test parameters; loading data into the system database; verifying limits; selecting a named set of limits; editing limits or parameter attributes; selecting components of characterization report; and running a report.

The characterization wizard helps a user upload tester data for analysis. The sequence that occurs includes: prompting for path, filename, and file format; prompting for conditions; prompting for a split lot association, if it exists; checking syntax; translating; defining pins, AC, and DC test parameters; loading; verifying limits; selecting a named set of limits; editing limits or parameter attributes; selecting components of characterization report; and running the report.

The characterization report resulting from the wizard will provide links to interactive analysis.

The following terms are calculated by the various reports that are generated: parametric yield, Cpk, SSE, SSR, SST, MSR, MSE, $R^2$ and Adjusted $R^2$.

Parametric yield represents the proportion of devices or parts passing the specification for a specific parameter.

$$100 \times \frac{\text{Number Pass}}{\text{Total Parts}}$$

For composite yield, Number Pass is the number of parts passing all specifications. Cp is the capability index. The general equation for the capability index, $C_p$, is:

$$Cp = \frac{USL - LSL}{6s}$$

This equation just says that the measure of process capability is how much of observed process variation is covered by the process specifications. In this case the process variation is measured by 6 standard deviations (+/−3 on each side of the mean). Clearly, if $C_p$>1.0, then the process specification covers almost all of our process observations. Cp does not account for parameters that are off-center.

The system can modify this equation slightly to account for off-center processes to obtain the $C_{pk}$ index as follows:

$$Cpk = \min\left[\frac{USL - \bar{x}}{3s}, \frac{\bar{x} - LSL}{3s}\right]$$

$C_{pk}$ accounts for a process being off center. This equation says to take the minimum distance between specification limits and the process mean and divide it by 3 standard deviations to arrive at the measure of process capability.

The method of least squares is a criterion for fitting a specified model to observed data. For example, it is the most commonly used method of defining a straight line through a set of points on a scatter plot.

In a linear regression, the fitted (predicted) value of the response variable Y is a linear combination of the values of one or more predictor (X) variables:

$$Y = \beta_0 + \beta_1 X_1 + \beta_1 X_{1i}^2 + \ldots + \beta_{1k} X_{1k}^k$$

An X variable in the model equation could be a nonlinear function of an observed variable (e.g., one might observe distance, but use distance squared as an X variable in the model, or X2 might be the square of X1), as long as the fitted Y remains a sum of terms that are each an X variable multiplied by a coefficient.

In regression analysis, the coefficient of determination is a measure of goodness-of-fit (i.e. how well or tightly the data fit the estimated model). The coefficient is defined as the ratio of two sums of squares:

$$R^2 = \frac{SSR}{SST}$$

Where SSR is the sum of squares due to regression, SST is the total sum of squares. By "sum of squares" we mean the sum of squared deviations between actual values and the mean (SST), or between predicted values and the mean (SSR). The coefficient of determination takes on values between 0 and 1, with values closer to 1 implying a better fit.

Adding more independent parameters to a regression model will only increase $R^2$ and not reduce it. Since $R^2$ can often be made large by including more parameters the adjusted-$R^2$ is used to account for the number of parameters.

$$R^2 = \left(\frac{n-1}{n-p}\right)\frac{SSR}{SST}$$

Although the present invention has been described in detail herein with reference to the illustrative embodiments, it should be understood that the description is by way of example only and is not to be construed in a limiting sense. It is to be further understood, therefore, the numerous changes in the details of the embodiments of this invention and additional embodiments of this invention will be apparent to, and may be made by, persons of ordinary skill in the art having reference to this description. It is contemplated that all such changes and additional embodiments are within the spirit and true scope of this invention as claimed below.

What is claimed is:

1. A system for providing characterization information for semiconductor products, comprising:
    a plurality of data sources, each of said data sources providing data pertaining to said products;
    a server coupleable to each of said plurality of data sources;

a database coupled to said server for storing data from said data sources;

an automatic data collection engine at said server for automatically collecting data from said sources;

a characterization engine resident at said server for operating on said data to provide characterization information;

a reporting application engine operable at said server for generating characterization reports from said characterization information;

said characterization reports being selectable.

2. A system in accordance with claim 1, wherein:

a network coupling said server and said plurality of data sources.

3. A system in accordance with claim 2, wherein:

said server is accessible via workstation devices coupled to said network.

4. A system in accordance with claim 2, wherein:

said network comprises the Internet.

5. A system in accordance with claim 4, wherein:

said server is coupleable to Internet devices coupled to said Internet.

6. A system in accordance with claim 5, comprising:

a web browser operable at each said Internet device for accessing said characterization reports.

7. A system in accordance with claim 1, wherein:

said data operated on by said characterization engine comprises pass/fail, parametric measurements, test limit values, and test conditions.

8. A system in accordance with claim 1, wherein:

said characterization engine comprises data model, selection, and analysis capabilities including part, pin, test, and test condition.

9. A system in accordance with claim 4, wherein:

said automatic data collection engine is provided with a URL for each of said data sources.

10. A system in accordance with claim 1, wherein;

said reporting engine provides visualization, statistics, data access, messaging and security.

11. A system in accordance with claim 4, wherein:

said characterization engine integrates selected data and reports in response to requests initiated at one of said Internet devices and received via said Internet.

12. A system in accordance with claim 11, wherein:

said server downloads said integrated data and reports via said Internet to said one Internet device for display to a user.

13. A system in accordance with claim 1, wherein:

said reporting application engine provides visual and analytical tools to research design and manufacturing problems.

14. A system in accordance with claim 11, wherein:

said reports enable a user at said one of said Internet devices to perform spatial analyses for both electrical test (PCM) and wafer sort (WAT) data.

15. A system in accordance with claim 14, wherein:

said spatial analyses comprise one or more of a single wafer map; a composite map; 200, 300 mm wafer maps; a wafer map gallery; a bin to parametric wafer map comparison; systematic and random yield calculation (Ys/Yr); row/column analysis; quadrant analysis; interactive wafer map manipulation; and display of site and die locations.

16. A system in accordance with claim 11, wherein:

said characterization engine selectively provides charts and graphs;

said charts and graphs comprising one or more of line trend, histogram; histogram gallery; box plot; box plot gallery; Pareto; Cp/Cpk trend; Schmoo plot; scatter and regression plots with fitting; and control charts.

17. A system in accordance with claim 11, comprising:

an interactive editor for creating split lot definitions.

18. A system in accordance with claim 17, wherein;

said characterization engine is operable to apply said split lot definitions to different analyses supplied by said system to permit study variation across splits.

19. A system in accordance with claim 15, wherein:

said server caches all analyses to enable all users at said Internet devices to share results.

20. A system in accordance with claim 1, wherein:

said server is operable to generate Schmoo plots.

21. A system in accordance with claim 20, wherein:

said Shmoo plots and composite pass/fail Shmoo plots and composite pass/fail Shmoo plots.

* * * * *